(12) United States Patent
Lee et al.

(10) Patent No.: US 7,268,014 B2
(45) Date of Patent: Sep. 11, 2007

(54) FABRICATION METHOD OF LIGHT EMITTING DIODE PACKAGE

(75) Inventors: Young Ki Lee, Seoul (KR); Seog Moon Choi, Seoul (KR); Yong Sik Kim, Seoul (KR); Sang Hyun Shin, Kyungki-do (KR)

(73) Assignee: Samsung Electro-Mechanics Co., Ltd. (KR)

( * ) Notice: Subject to any disclaimer, the term of this patent is extended or adjusted under 35 U.S.C. 154(b) by 0 days.

(21) Appl. No.: 11/314,003

(22) Filed: Dec. 22, 2005

(65) Prior Publication Data

US 2006/0246617 A1 Nov. 2, 2006

(30) Foreign Application Priority Data

Apr. 30, 2005 (KR) .................... 10-2005-0036572

(51) Int. Cl.
*H01L 21/00* (2006.01)
(52) U.S. Cl. .................... 438/106; 438/25; 438/27; 438/31; 438/23; 257/79; 257/80; 257/81
(58) Field of Classification Search .................... 438/30
See application file for complete search history.

(56) References Cited

U.S. PATENT DOCUMENTS 6,160,270 A * 12/2000 Holmberg et al. ............ 257/59
6,822,269 B2 * 11/2004 Horiuchi et al. ............... 257/99
2005/0151142 A1 * 7/2005 Imai ............................ 257/81
2006/0001344 A1 * 1/2006 Ohkubo et al. ............. 313/271

FOREIGN PATENT DOCUMENTS

JP     2003-163378     6/2003
JP     2003-218398     7/2003

* cited by examiner

*Primary Examiner*—Matthew Smith
*Assistant Examiner*—Ankush Singal
(74) *Attorney, Agent, or Firm*—McDermott Will & Emery LLP

(57) ABSTRACT

The invention provides a fabrication method of an LED package for easily fabricating LED packages of excellent heat radiation characteristics. In the method, a metallic package substrate having a recess and a reflecting surface formed in the recess is prepared, and the package substrate is selectively anodized and divided into two package electrode parts divided from each other. Then, an light emitting device is mounted on the bottom of the recess. Preferably, the package substrate is a metal substrate made of Al or Al-based metal.

19 Claims, 10 Drawing Sheets

FABRICATION METHOD OF LIGHT EMITTING DIODE PACKAGE

RELATED APPLICATION

The present application is based on and claims priority from Korean Application Number 2005-36572, filed Apr. 30, 2005, the disclosure of which is hereby incorporated by reference herein in its entirety.

BACKGROUND OF THE INVENTION

1. Field of the Invention

The present invention relates to a fabrication method of a light emitting diode package, more particularly, which can achieve excellent heat radiation as well as facilitate mass production.

2. Description of the Related Art

Recent development of Light Emitting Diode (LED) devices made of compound semiconductor material such as GaAs, GaN and AlGaInP has enabled lighting sources of various colors. Decisive factors of LED properties may include color, brightness and optical conversion efficiency. While such LED properties are primarily determined by compound semiconductor material and its internal structure used for an LED device, a package structure for housing the LED device acts as a secondary factor, giving great influence on the LED properties. In order to realize light emitting efficiency to such a degree that can satisfy user demand, it is necessary to improve not only first factors such as the material and structure of an LED device but also secondary factors such as an LED package structure and its material.

In particular, as LED application is spreading to various fields such as interior and outdoor illumination, automobile headlight, backlight unit of a display system, high efficiency and high heat radiation have become necessary. If heat is not efficiently radiated from an LED device, it raises the temperature of the LED device, thereby deteriorating LED device properties while shortening its lifetime. Accordingly, various endeavors have been made to effectively radiate heat out of the LED device. As an approach for improving heat radiation characteristics of an LED package, Japanese Laid-Open Patent Application No. 2003-218398 proposes to use a metal substrate divided by a narrow slot as an LED package substrate. Besides, Japanese Laid-Open Patent Application 2003-163378 discloses an approach for fabricating a package substrate which is divided by a narrow slot and made integrally with a reflector.

FIG. 1 is a cross-sectional view schematically illustrating the structure of a conventional LED package 10. Referring to FIG. 1, the LED package 10 includes a package substrate 1 made of metal. The package substrate 1 is divided into two package electrodes 1a and 1b by a slot 6 where insulator 2 of for example epoxy resin and so on is filled. The package substrate 1 has a recess 3, such that an LED device 7 is flip-chip bonded onto the package electrodes 1a and 1b at the bottom of the recess 3. Underfill resin 4 is filled between the LED device 7 and the bottom of the recess 3. A cover panel 9 made of glass is bonded onto the top of the package substrate 1. Sidewall of the recess 3 forms a reflector surface 1c, which reflects light propagating in lateral direction to redirect it in upward direction.

FIGS. 2a to 2d are cross-sectional views illustrating a fabrication process of an LED package as shown in FIG. 1. Referring to FIG. 2a first, a package substrate 1 having a reflector surface 1c in a recess 3 is formed by molding or press molding of metal. Then, as shown in FIG. 2b, a slot 6 is formed in the package substrate 1, dividing it into two package electrodes 1a and 1b. The slot 6 is formed by machining such as press trimming or laser processing. Insulator 2 of for example epoxy resin is filled into the slot 6, and through flip-chip bonding, an LED device 7 is mounted on the package electrodes 1a and 1b at the bottom of the recess 3 as shown in FIG. 2c. Underfill resin is also filled between the LED device 7 and the bottom of the recess 3. Then, as shown in FIG. 2d, a cover panel 9 made of glass is bonded onto the top of the package substrate 1, thereby producing an LED package as shown in FIG. 2d.

Since the package substrate 1 is made of metal, it can effectively radiate heat from the LED device 7. However, in order to fabricate the LED package 10, a metal substrate (i.e., package substrate) has to be machined precisely so that the package substrate 1 is divided by the narrow slot 6, and insulator 2 has to be filled into the narrow slot 6. However, there is no easy way to from the narrow slot 6 in the metal substrate by machining or laser processing. This as a result causes high defective proportion as well as poor yield.

SUMMARY OF THE INVENTION

The present invention has been made to solve the foregoing problems of the prior art and it is therefore an object of the present invention to provide a fabrication method of an LED package, by which LED packages of excellent heat radiation characteristics can be fabricated more easily and precisely.

In order to realize the foregoing object, the invention provides a fabrication method of a light emitting diode package, comprising steps of: preparing a metallic package substrate having a recess and a reflecting surface formed in the recess; selectively anodizing the package substrate into two package electrode parts divided from each other; and mounting an light emitting device on a bottom of the recess. Preferably, the package substrate is made of Al or Al-based metal.

According to an embodiment of the invention, the package substrate preparing step may comprise: providing a mask pattern on a metal substrate; selectively anodizing the metal substrate by using the mask pattern to form an anodic oxide region in the metal substrate; and etching the anodic oxide region to produce the recess in the metal substrate. Preferably, the mask pattern may be formed to expose a predetermined top surface area of the metal substrate and cover an underside of the metal substrate, in which the predetermined top area of the metal substrate corresponds to an area where an anodic oxide region will be formed to provide the recess.

Alternatively, said package substrate preparing step may comprise: producing the package substrate by injection molding or press molding of metal.

As another alternative, said package substrate preparing step may comprise: forming an etching mask pattern on a metal substrate; and selectively etching the metal substrate by using the etching mask pattern to form the recess in the metal substrate.

According to another embodiment of the invention, said package substrate anodizing step may comprise: forming a mask pattern on the package substrate; and selectively anodizing the package substrate by using the mask pattern to form an oxide membrane in the package substrate, the oxide membrane dividing the package substrate into the electrode parts. Preferably, the mask pattern may be formed to expose a predetermined underside area of the package substrate and cover a top surface of the package substrate in which the predetermined top area of the metal substrate corresponds to an area where an anodic oxide region will be formed to provide the recess.

According to further another embodiment of the invention, said light emitting device mounting step may comprise: connecting the light emitting device to one of the package electrode parts by die bonding; and connecting the light emitting device to the other package electrode part at the bottom of the recess by wire bonding.

According to another embodiment of the invention, said light emitting device mounting step may comprise: connecting the light emitting device to the package electrode parts by wire bonding of two wires.

According to further another embodiment of the invention, said light emitting device mounting step may comprise: flip-chip bonding the light emitting device on the package electrode parts at the bottom of the recess.

According to other embodiment of the invention, a reflective metal film may be formed on a side surface of the recess before said light emitting device mounting step. For example, the metal film formed on the side surface may be made of Au, Ag, Ti or Al to form a light-reflecting surface of high reflectivity on the side surface of the recess.

According to another embodiment of the invention, the fabrication method may further comprise a step of: surface-treating the bottom of the recess with metal selected from a group consisting of Au, Ag and Al before said light emitting device mounting step in order to facilitate mounting of the light emitting device. For example, the bottom of the recess may be plated with for example Ag or printed with Ag containing ink by ink-jet printing. Such surface treatment on the recess bottom can provide a surface adequate for bonding of the light emitting device.

According to further another embodiment of the invention, the fabrication method may further comprise a step of: surface-treating the bottom of the package substrate by Au or Ag plating before said light emitting device mounting step. Such surface treatment on the recess bottom can provide a surface adequate for bonding of the light emitting device.

According to other embodiment of the invention, an optical element such as a glass panel, convex lens or concave lens may be bonded to a top of the package substrate after said light emitting device mounting step. The optical element may act as a cover plate to seal the light emitting device.

The fabrication method of the invention can be easily applied to bulk production of a number of LED packages in an LED package array. That is, the invention provides means for producing an LED package array in which a number of LED packages are arranged from a metal plate (or wafer level metal substrate). By severing the LED package array, a number of individual LED packages can be produced simultaneously.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 3:
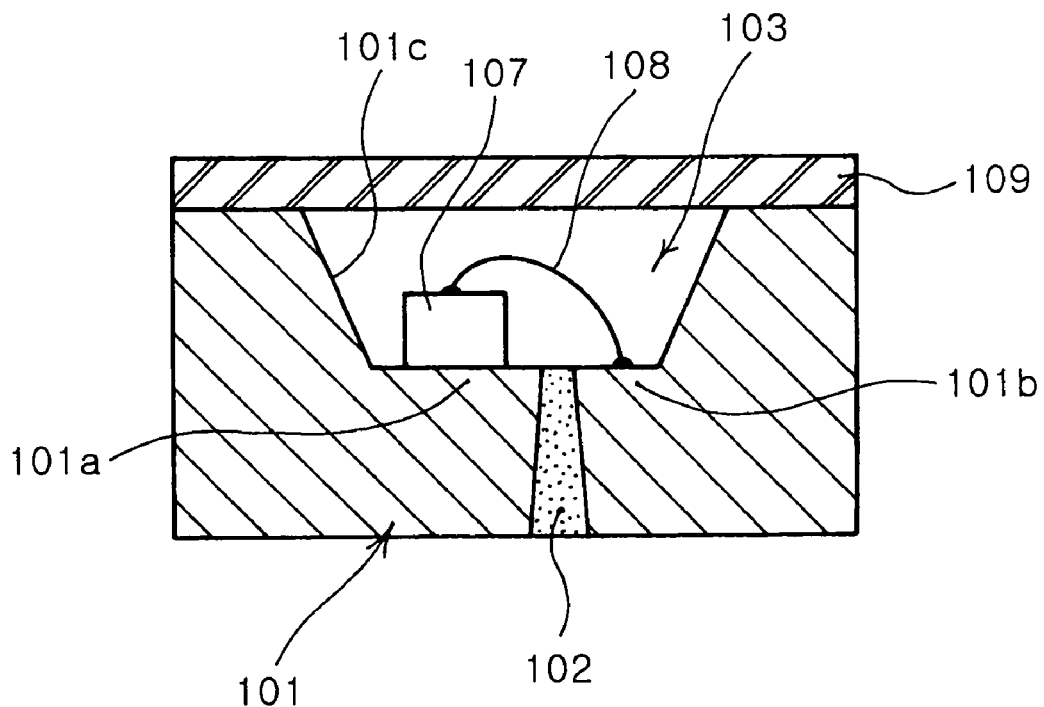
FIG. 3 is a cross-sectional view illustrating an LED package fabricated according to an embodiment of the invention.
Figure 4:
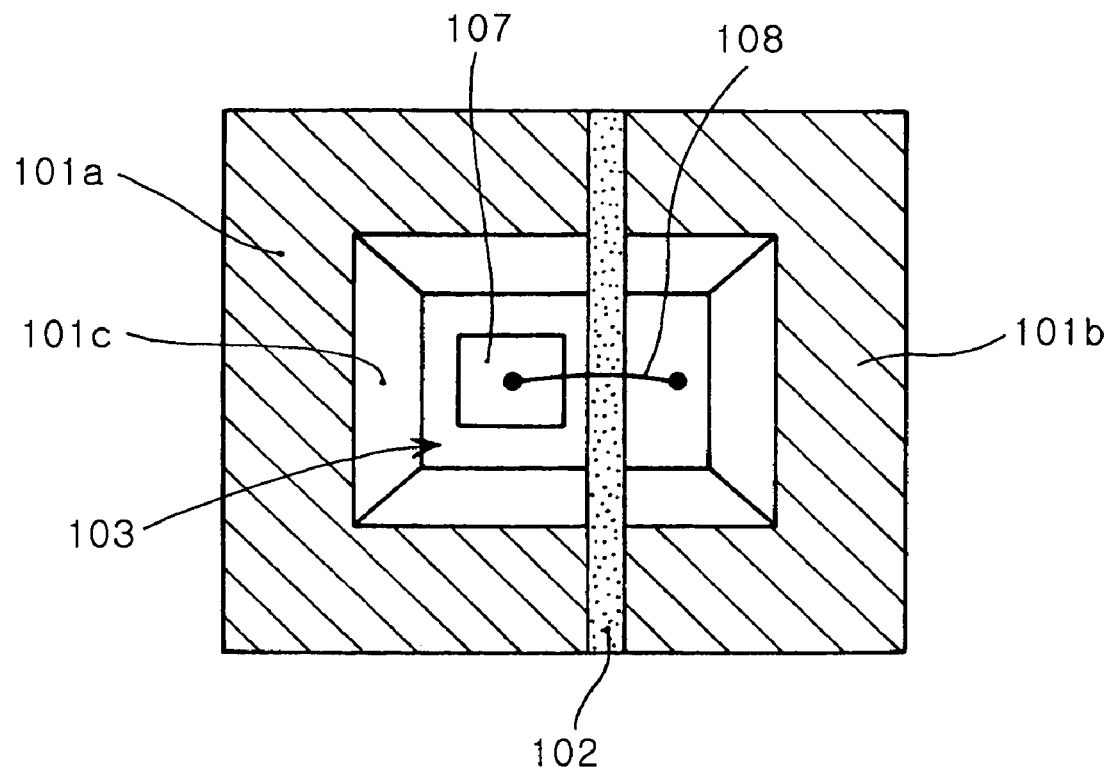
FIG. 4 is a plan view of the LED package shown in FIG. 4.

Preferred embodiments of the present invention will now be described in detail with reference to the accompanying drawings. While the present invention will be shown and described in connection with the preferred embodiments, it will be apparent to those skilled in the art that modifications and variations can be made without departing from the spirit and scope of the invention as defined by the appended claims. The embodiments of the present invention are only aimed to provide a full explanation to a person having ordinary skill in the art. Therefore, the shape and size of the elements in the diagrams may be exaggerated for clearer explanation, with the same reference numerals designating the same elements throughout the drawings FIG. 3 is a cross-sectional view illustrating an LED package 100 fabricated according to an embodiment of the invention, and FIG. 4 is a plan view of the LED package 100 shown in FIG. 4. Referring to FIGS. 3 and 4, the LED package 100 includes a vertical LED device 107 and a metallic package substrate 101. The package substrate 101 is an Al substrate or an Al-based metal substrate. The package substrate 101 has a recess 103 that provides a mounting space for an LED device as well as a light-reflecting surface. Accordingly, in the LED package 100, a light-reflecting part and a substrate part (submount part) are made integral. A reflective film made of for example Au, Ag or Al is coated on the side surface of the recess 103, thereby forming a reflecting surface 101c of high reflectivity.

The package substrate 101 is divided into two package electrodes 101a and 101b by an anodic oxide membrane 102 of $Al_2O_3$. The LED device 107 is die bonded to one package electrode 101a of the divided two package electrodes 101a and 101b and wire bonded to the other package electrode 101b by a wire 108. An optical element such as a glass panel, a concave lens and a convex lens is bonded to the top of the package substrate 101.

Figure 1:
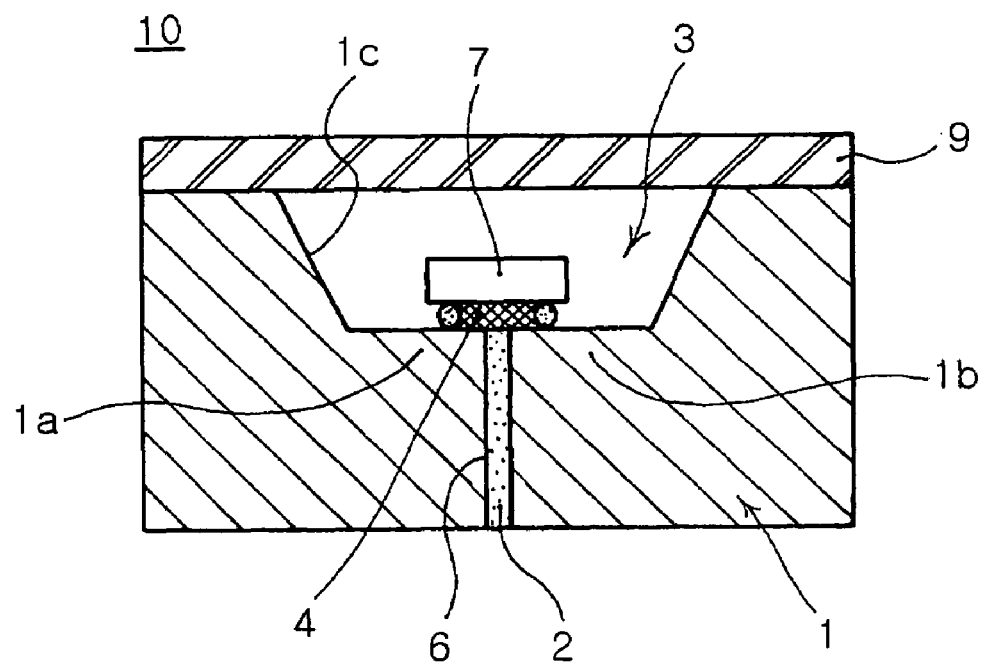
FIG. 1 is a cross-sectional view illustrating a conventional LED package.
Figure 2A:
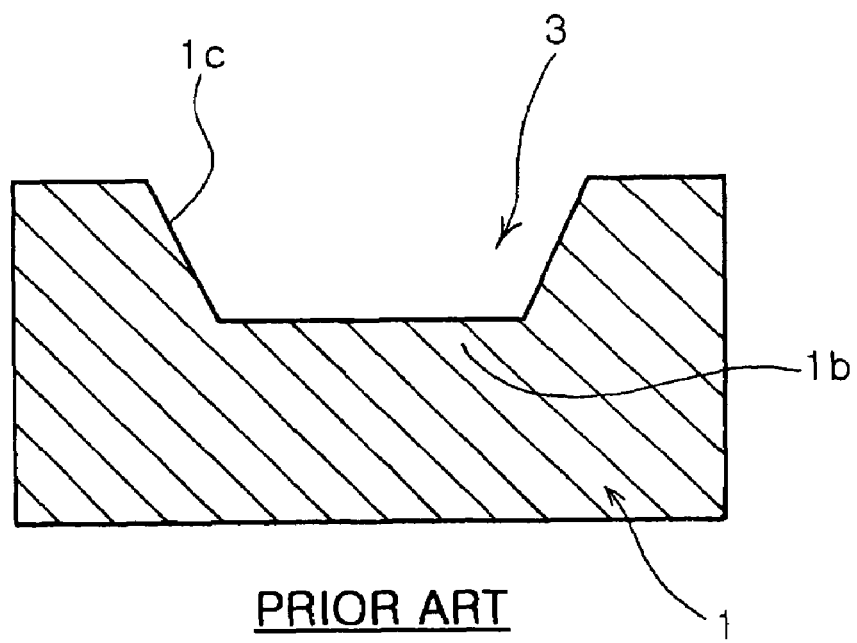
FIGS. 2a to 2d are cross-sectional views illustrating a fabrication process of a conventional LED package.
Figure 2B:
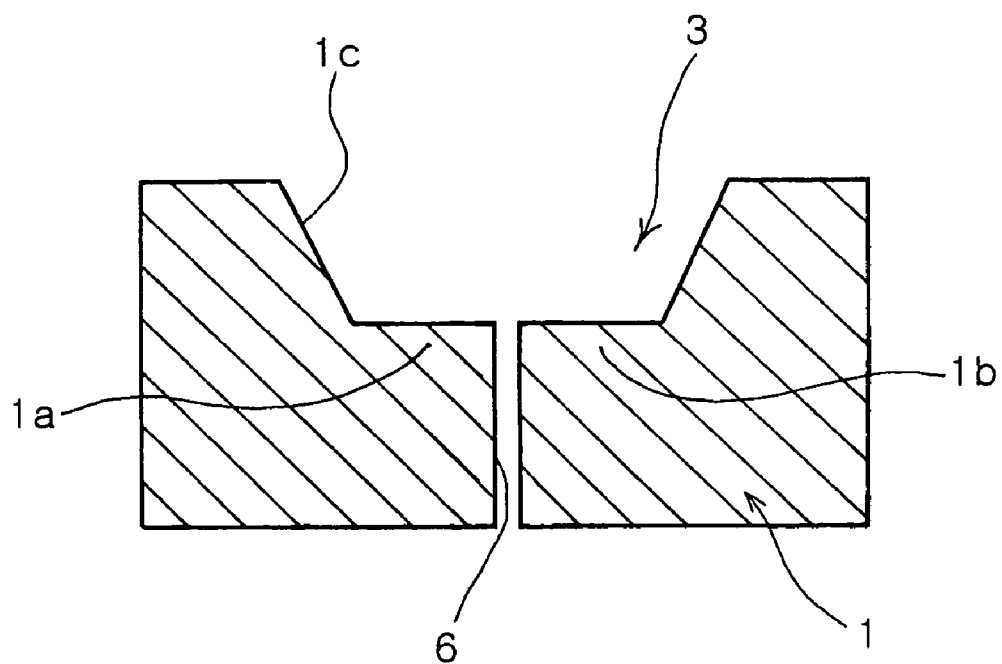
Figure 2C:
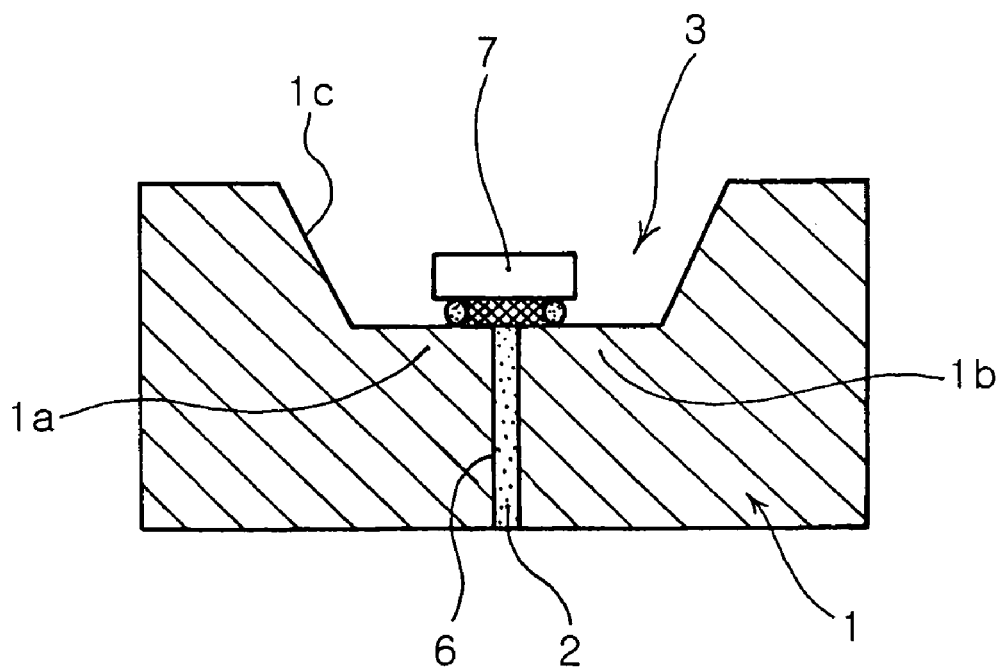
Figure 2D:
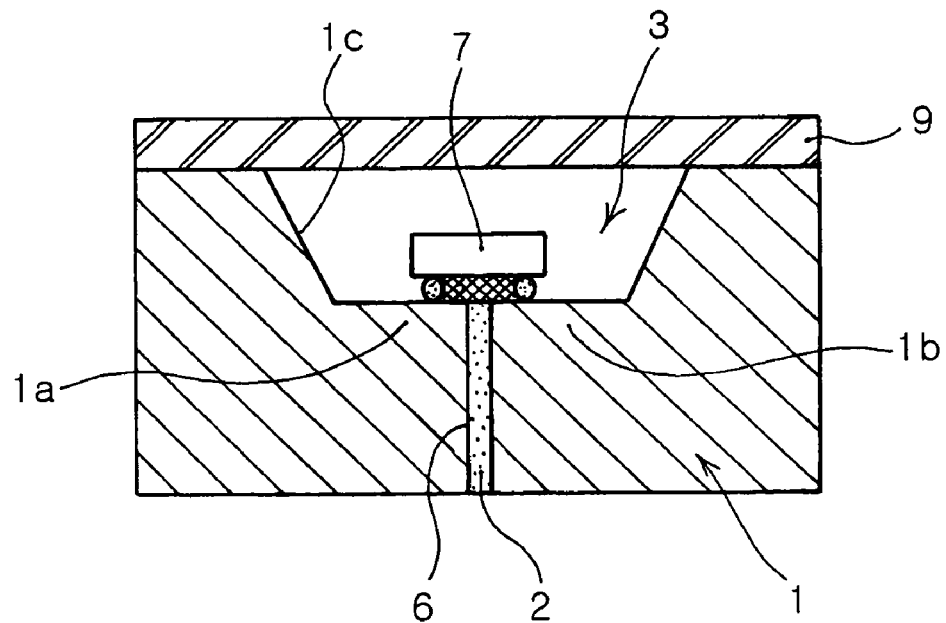

The LED package 100 exhibits excellent heat radiation characteristics since the package substrate 101 of the LED package 100 is made of metal and has the integrally formed reflector. Furthermore, since the package electrodes are divided from each other by the anodic oxide membrane 102 instead of the slot 6 (refer to FIG. 1), the package 100 can be fabricated easily as will be described hereunder.

Figure 5:
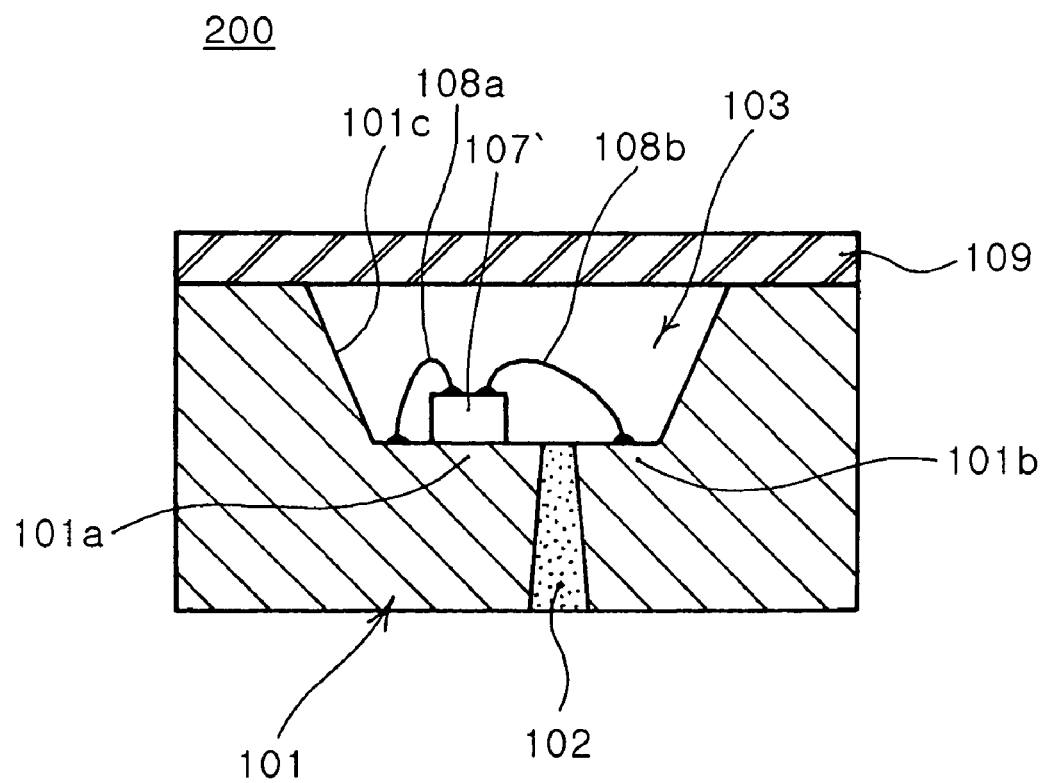
FIG. 5 is a cross-sectional view illustrating an LED package fabricated according to another embodiment of the invention.

FIG. 5 is a cross-sectional view illustrating an LED package 200 fabricated according to another embodiment of the invention. The LED package 200 shown in FIG. 5 is substantially the same as the LED package 100 shown in FIG. 3 except that an LED device 107' is connected to package electrodes 101a and 101b by two wires 108a and 108b. The LED device 107' shown in FIG. 5 is of a horizontal structure unlike the LED device 107 shown in FIG. 3. Other components are the same as those illustrated in FIG. 3, and their description will be omitted.

Figure 6:
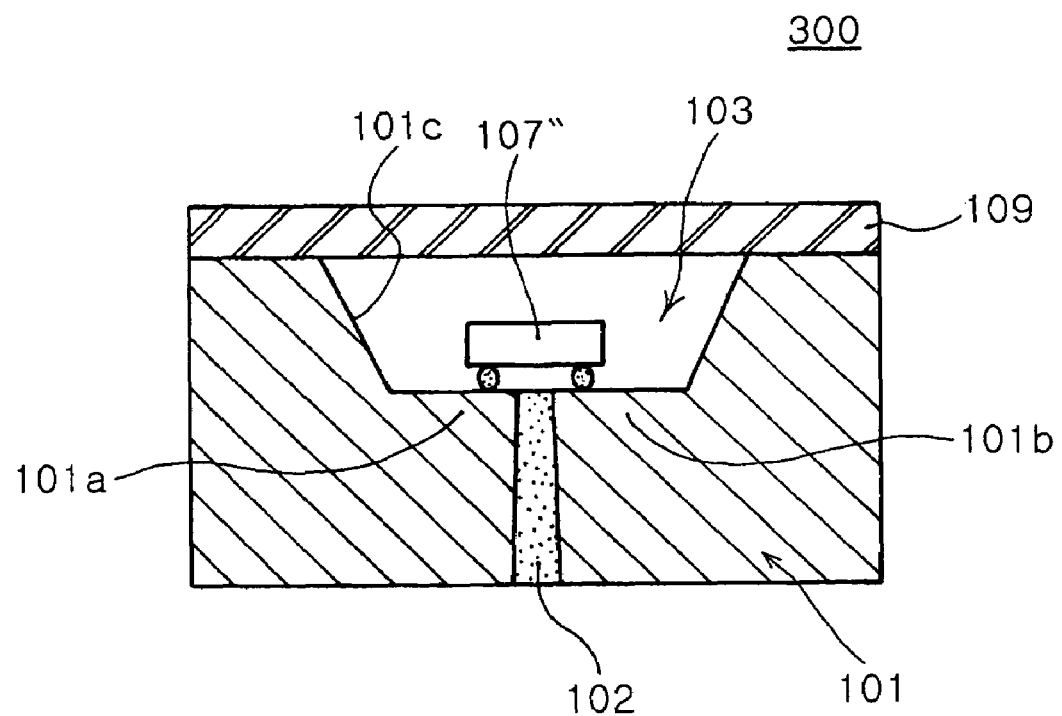
FIG. 6 is a cross-sectional view illustrating an LED package fabricated according to further another embodiment of the invention.

FIG. 6 is a cross-sectional view illustrating an LED package 300 fabricated according to further another embodiment of the invention. The LED package 300 shown in FIG. 6 is substantially the same as the LED package 100 shown in FIG. 3 except that an LED device 107" is connected to package electrodes 101a and 101b by flip-chip bonding instead of die bonding or wire bonding. The LED device 107″ shown in FIG. 6 is of a horizontal structure unlike the LED device 107 shown in FIG. 3. Other components are the same as those illustrated in FIG. 3, and their description will be omitted.

Figure 7:
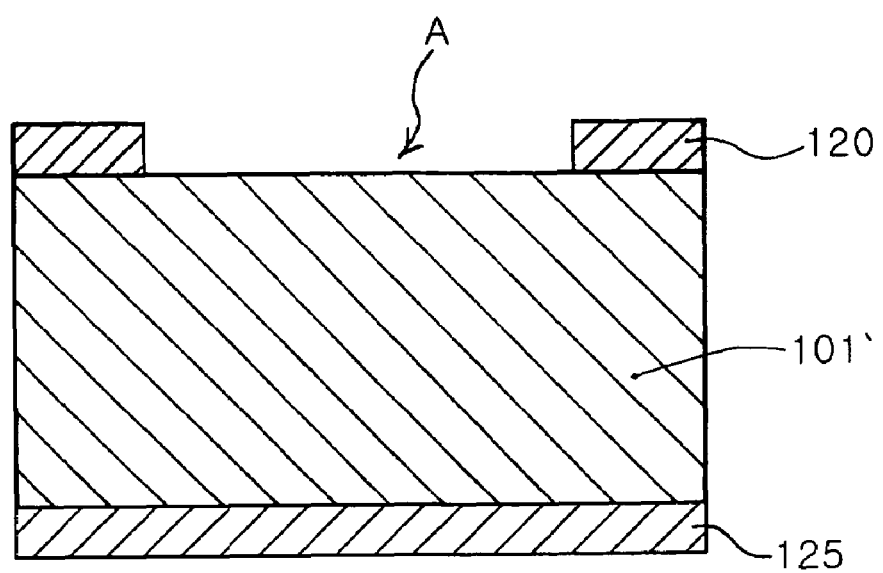
FIGS. 7 to 14 are cross-sectional views illustrating a fabrication process of an LED package according to an embodiment of the invention.

FIGS. 7 to 14 are cross-sectional views illustrating a fabrication process of an LED package according to an embodiment of the invention. Referring to FIG. 7 first, a metal substrate 101′ made of Al or Al-based metal is prepared, and mask patterns 120 and 125 are provided on the metal substrate 101′. The mask patterns 120 and 125 act as a mask in following selective anodization. Describing it in more detail, the mask pattern 120 provided on the top surface of the metal substrate 101′ exposes a predetermined area A of the metal substrate 101′, and the mask pattern 125 covers the underside of the metal substrate 101′. The area A corresponds to a predetermined region of the metal substrate 101′ to be formed into a recess which will provide a mounting space for an LED device. The mask patterns 120 and 125 may be made of for example photoresist or metal such as Ti and Au.

Figure 8:
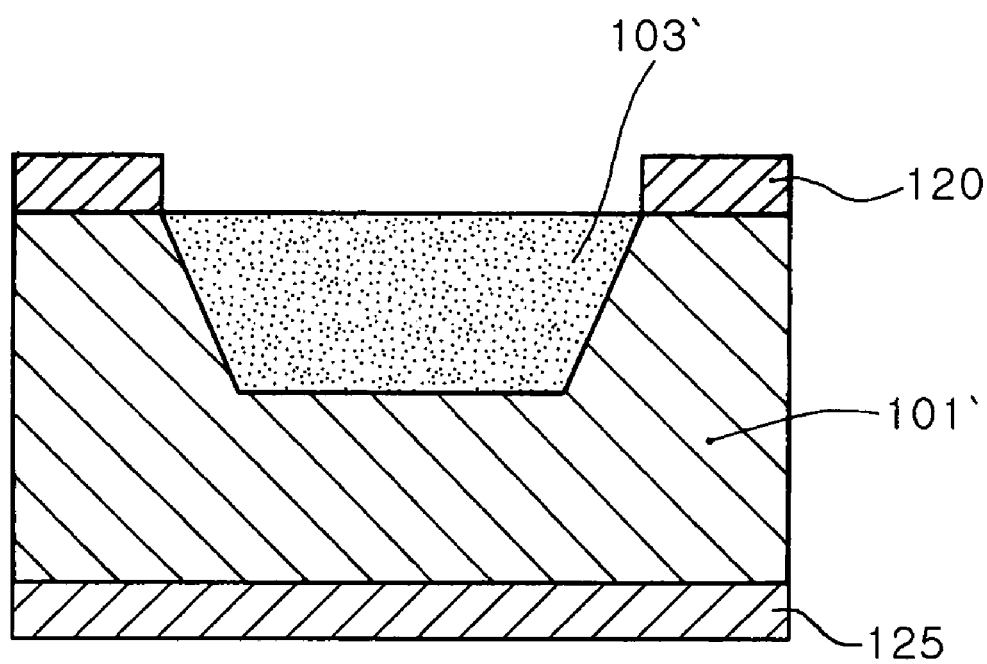
Figure 9:
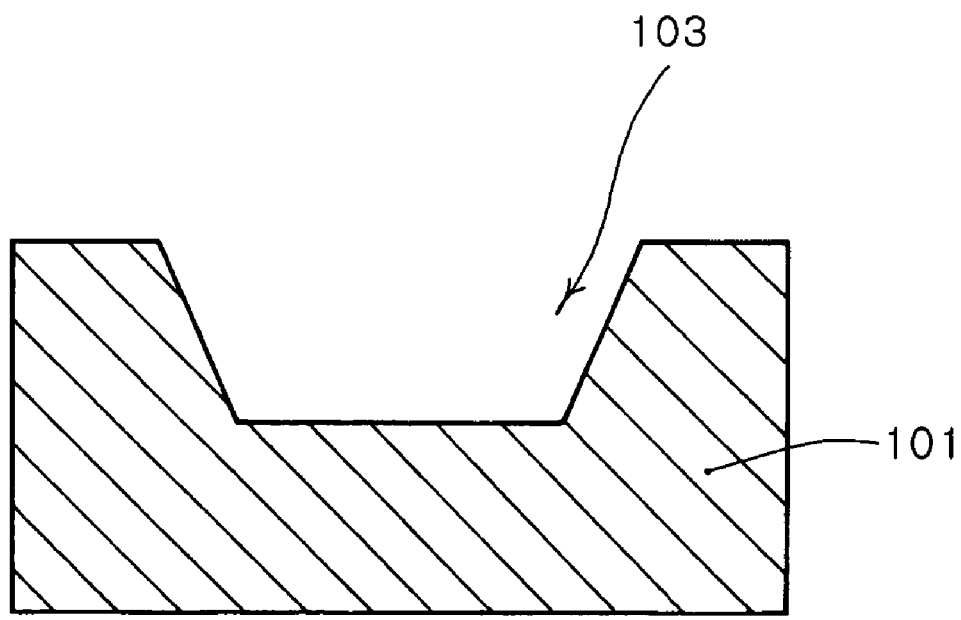

Then, the metal substrate 101′ is selectively anodized by the mask patterns 120 and 125, forming an anodic oxide region 103′ as shown in FIG. 8. The anodic oxide region 103′ is made of $Al_2O_3$ that is produced by anodic oxidation of Al. Then, the anodic oxide region 103′ is etched by for example phosphoric acid solution to remove the anodic oxide region 103′, as shown in FIG. 9, thereby producing a package substrate 101 having a recess 103.

Figure 10:
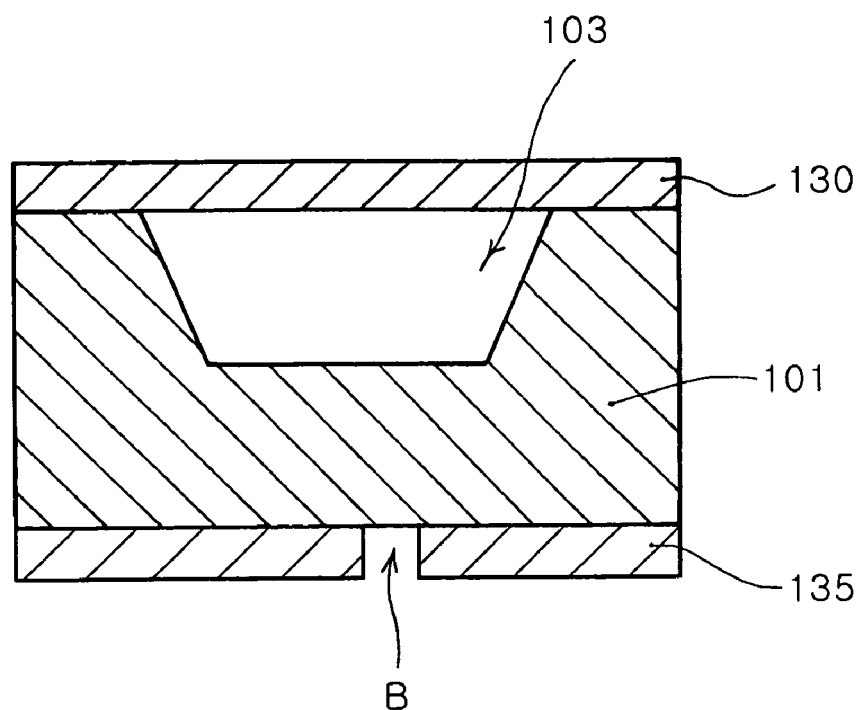

Then, as shown in FIG. 10, mask patterns 130 and 135 are provided on the package substrate 101. Describing it in more detail, the mask pattern 135 provided on the underside of the package substrate 101 exposes a predetermined area B of the package substrate 101, and the mask pattern 130 covers the top surface of the package substrate 101. The mask patterns 130 and 135 may be made of photoresist or metal such as Ti and Au like the mask patterns 120 and 125.

Figure 11:
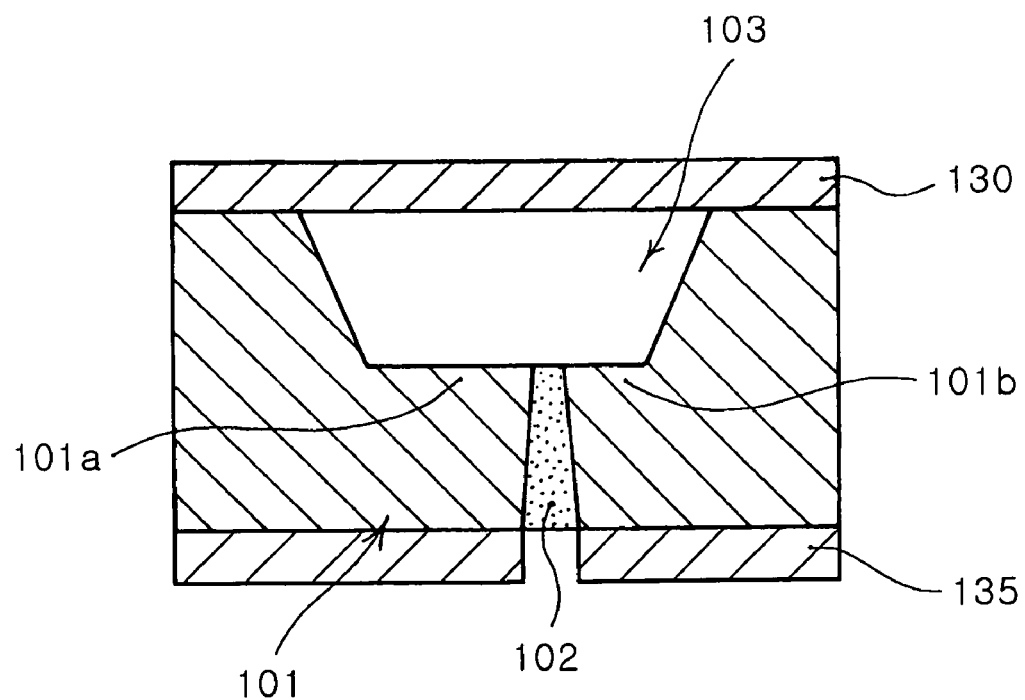

Then, as shown in FIG. 11, the package substrate 101 is selectively anodized with the mask patterns 130 and 135, thereby forming an anodic oxide membrane 102. The anodic oxide membrane 102 is made of insulator such as $Al_2O_3$, and thus acts to divide the package substrate 101 into two electrodes 101a and 101b.

Figure 12:
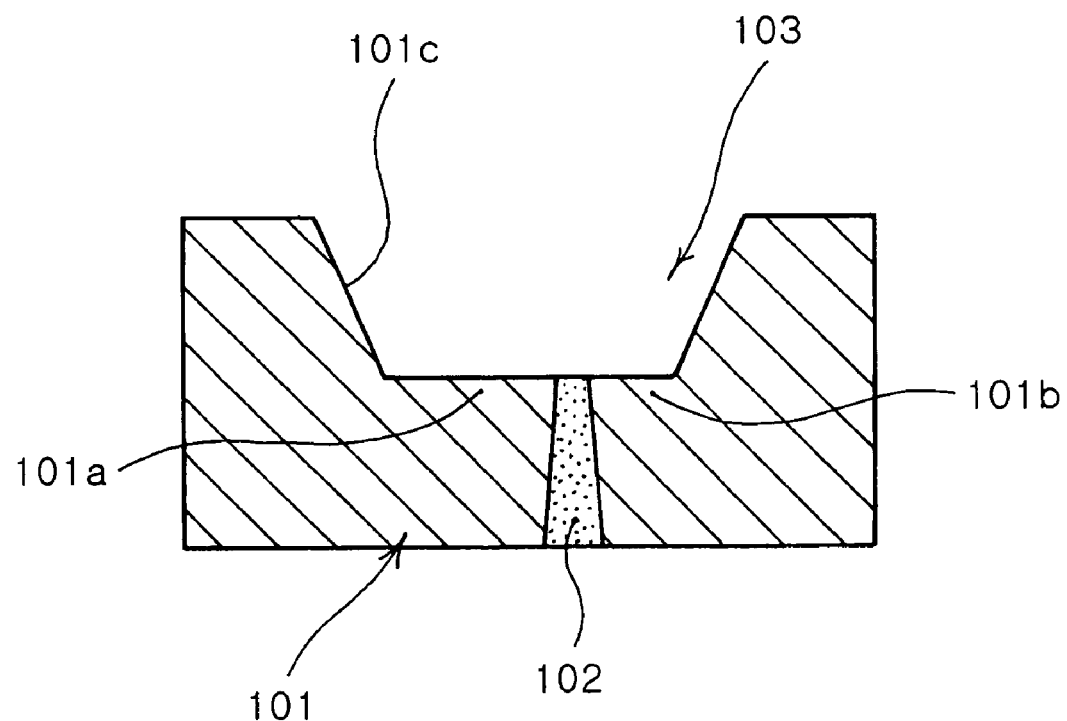

Then, the mask patterns 130 and 135 are completely removed, as shown in FIG. 12, by for example stripping. Preferably, a reflective metal film of for example Au, Ag, Ti or Al is coated on the side surface of the recess 103 that forms a reflecting surface 101c. This as a result can raise the reflectivity of the reflecting surface 101c. For example, the side surface of the recess 103 may be Ag plated or Al deposited. Furthermore, in order to produce a surface suitable for following bonding of an LED device, the bottom of the recess 103 may be surface-treated with for example Au, Ag or Al. For example, the bottom of the recess 103 may be surface-treated by Au or Ag plating or ink jet printing that uses Ag— or Al-containing ink.

In order to produce a surface suitable for mounting the LED package on any external terminal, the underside of the package substrate 101 is surface-treated by Au or Ag plating. The underside of the package substrate 101 may be surface-treated simultaneously with the bottom of the recess 103.

Figure 13:
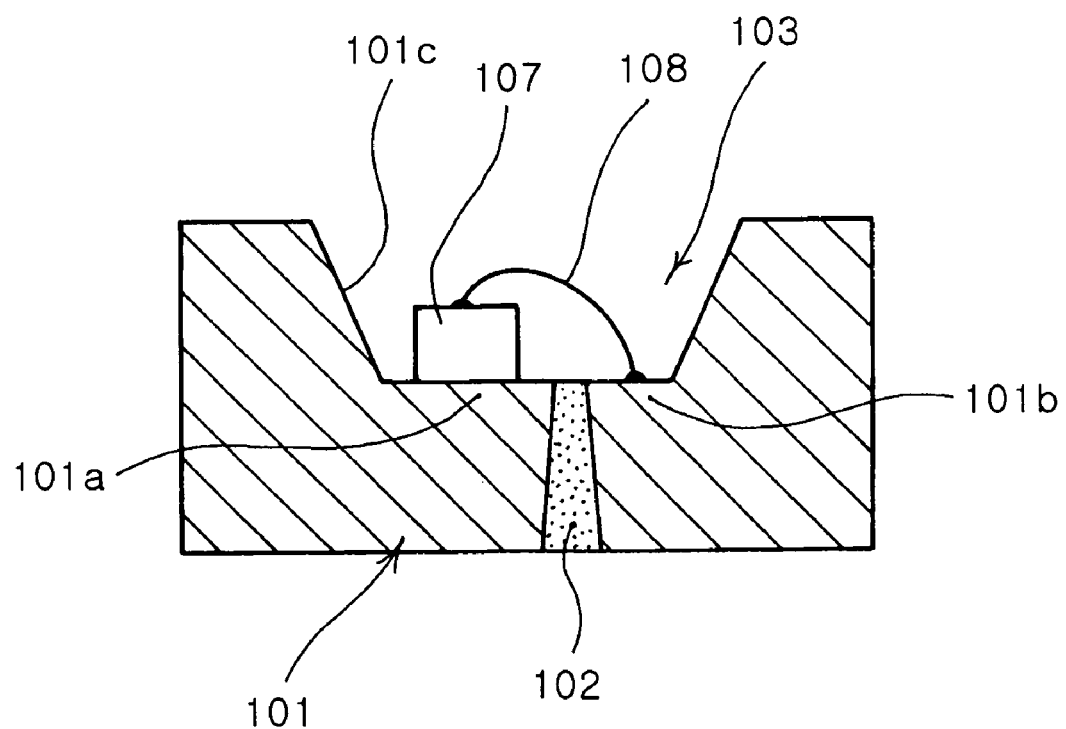

Then, as shown in FIG. 13, an LED device 107 of a vertical structure is mounted on the bottom of the recess 103. Describing it in detail, the LED device 107 is die bonded onto the package electrode 101a at the bottom of the recess 103, thereby connecting a bottom electrode of the LED device 107 to the electrode 101a. The die bonding may be carried out by eutectic bonding or by using conductive paste. Then, the LED device 107 is wire bonded to the package electrode 101b by a wire 108. This as a result electrically connects the LED device 107 to the electrodes 101a and 101b.

In addition to such die bonding or wire bonding, the LED device can be connected to the electrodes for example by wire bonding using a pair of wires or flip-chip bonding (using a pair of solder bumps). That is, as illustrated in FIG. 5, two wires 108a and 108b may be used to connect the electrodes of the vertical structure LED device 107′ to the package electrodes 101a and 101b, respectively. Then, the LED device 107′ may be die bonded to the bottom of the recess 103 by using conductive paste.

Also, as illustrated in FIG. 6, with the electrodes of the horizontal structure LED device 107″ being oriented toward the bottom of the recess 103, the LED device 107″ may be flip-chip bonded to the package electrodes 101a and 101b by bumps prepared beforehand.

Figure 14:
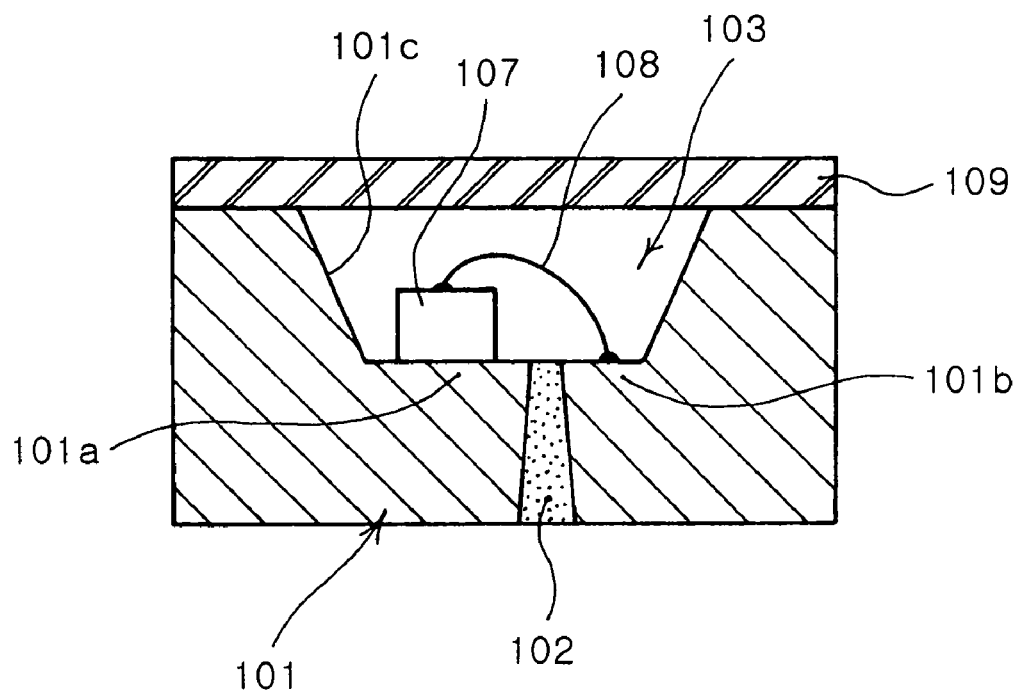

Moreover, as shown in FIG. 14, an optical element 109 such as a glass panel, convex lens and concave lens may be bonded to the top of the package substrate 101. The optical element 109 functions as a cover plate sealing the LED device 107. However, the optical element 109 is not essentially required in the invention.

According to this embodiment, the metal substrate 101 provides a light-reflecting part and a base (i.e., submount). Thus, the LED package has excellent heat radiation characteristics. Furthermore, the slot of the prior art is not required any more. The package substrate 101 is divided into two electrodes 101a and 101b by selective anodization using mask patterns instead. Accordingly, the LED package can be fabricated very easily compared to the prior art.

While this embodiment has been illustrated as the recess 103 is formed in the package substrate 101 by selective anodization, the recess 103 may be formed in an alternative process. For example, a package substrate 101 with a recess 103 may be formed by injection molding or press molding of metal. Furthermore, a recess 103 may also be formed by selectively etching a metal substrate.

Figure 16:
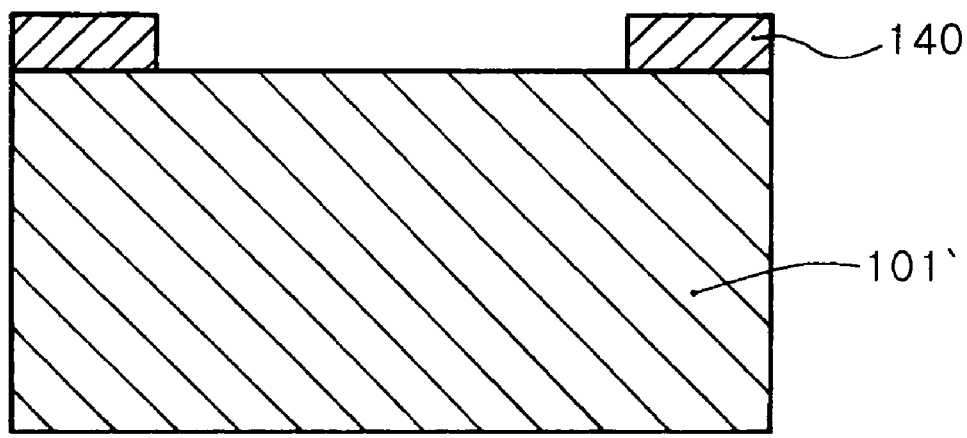
FIGS. 16 and 17 are cross-sectional views illustrating a fabrication process of an LED package according to further another embodiment of the invention.
Figure 17:
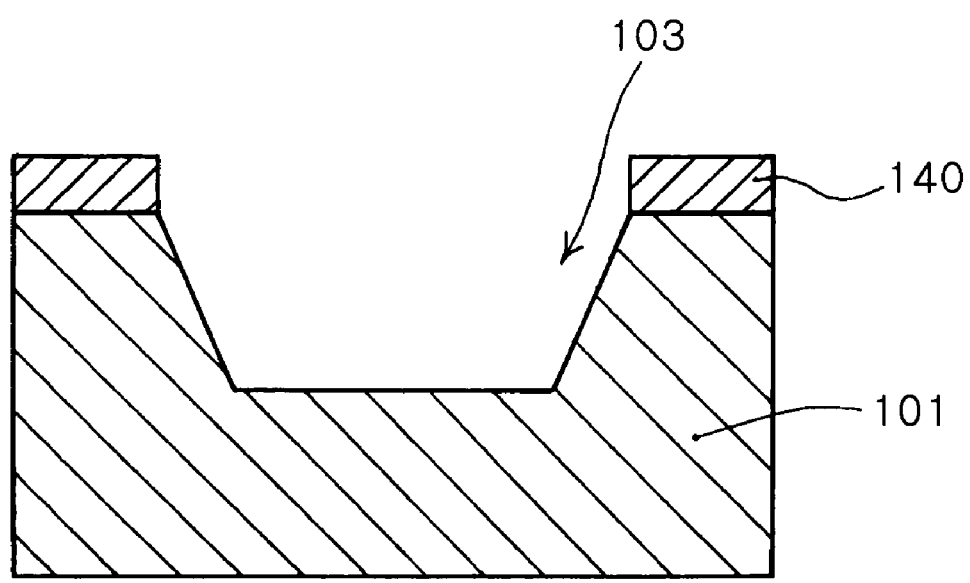

FIGS. 16 and 17 show a process for forming a recess in a metal substrate by selective etching. First, as shown in FIG. 16, a mask pattern (or etching mask) 140 is provided on a metal substrate 101′, exposing an area of the metal substrate 101′ to be formed into a recess. Then, the metal substrate 101′ is selectively etched by using the mask pattern 140 to form a recess 103 in the metal substrate 101′, as shown in FIG. 17, thereby producing a package substrate 101 with the recess 103. Thereafter, a process steps as illustrated in FIGS. 10 to 14 are carried out to produce a desired LED package.

Figure 15:
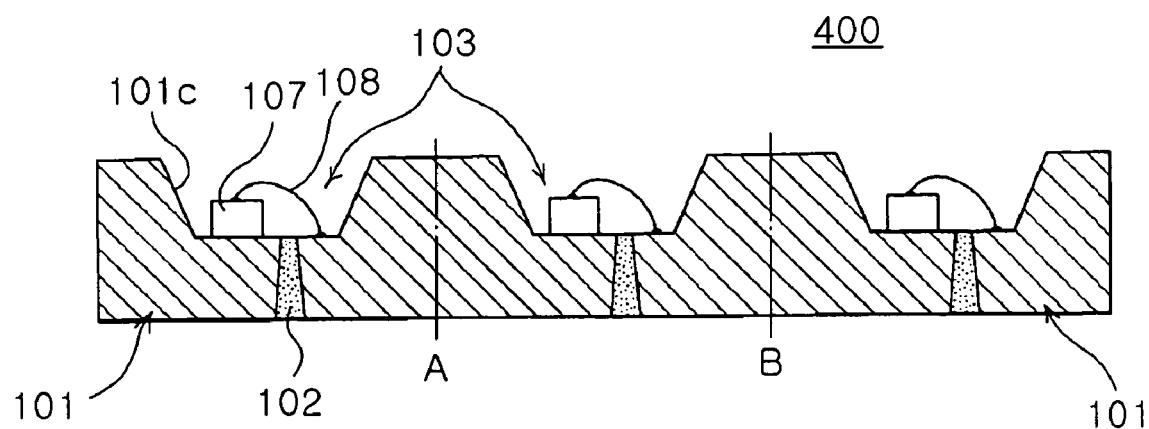
FIG. 15 is a cross-sectional view illustrating an LED package array fabricated according to an embodiment of the invention.

The LED package fabrication process of the invention as described above can be applied, as it is, to bulk production of a number of LED packages in an LED package array. Referring to FIG. 15, a number of package substrates 101 are produced from a metal plate (or wafer level metal substrate) by forming a number of recesses 103 each having a reflecting surface 101c therein. Next, selective anodization is performed to form an anodic oxide membrane 102 in each package substrate 101, thereby dividing the package substrate 101 into package electrodes. Then, an LED device 107 is mounted on the bottom of each recess 103. This as a result produces an LED package array 400 in which a number of LED packages are arrayed and connected together. In addition, a cover plate or optical element may be bonded to the top surface of the package substrates 101 to cover the package array 400.

The LED package array 400 can be used in for example an illumination system or LCD backlight unit. The LED package array 400 can also be severed along cutting lines A and B into individual LED packages. This as a result simultaneously produces a number of individual LED packages. As described above, the LED fabrication process of the invention can be used to easily produce an LED package array, in a manner adequate for mass production of LED packages.

According to the present invention as described hereinbefore, it is possible to divide a metallic package substrate into two electrodes by selective anodization, thereby easily fabricating LED packages of excellent heat radiation characteristics. Furthermore, the fabrication process of LED packages of the invention is adequate for bulk production of a number of LED packages, thereby enabling mass production of high quality LED packages at low cost.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A fabrication method of a light emitting diode package, comprising steps of:
   (a) preparing a metallic package substrate having a recess and a reflecting surface formed in the recess;
   (b) selectively anodizing the package substrate into two package electrode parts divided from each other; and
   (c) mounting an light emitting device on a bottom of the recess.

2. The fabrication method according to claim 1, wherein the package substrate is made of Al or Al-based metal.

3. The fabrication method according to claim 1, wherein said package substrate preparing step (a) comprises:
   providing a mask pattern on a metal substrate;
   selectively anodizing the metal substrate by using the mask pattern to form an anodic oxide region in the metal substrate; and
   etching the anodic oxide region to produce the recess in the metal substrate.

4. The fabrication method according to claim 3, wherein the mask pattern is adapted to expose a predetermined top surface area of the metal substrate and cover an underside of the metal substrate.

5. The fabrication method according to claim 1, wherein said package substrate preparing step (a) comprises: producing the package substrate by injection molding or press molding of metal.

6. The fabrication method according to claim 1, wherein said package substrate preparing step (a) comprises:
   forming an etching mask pattern on a metal substrate; and
   selectively etching the metal substrate by using the etching mask pattern to form the recess in the metal substrate.

7. The fabrication method according to claim 1, wherein said package substrate anodizing step (b) comprises:
   forming a mask pattern on the package substrate; and
   selectively anodizing the package substrate by using the mask pattern to form an oxide membrane in the package substrate, the oxide membrane dividing the package substrate into the electrode parts.

8. The fabrication method according to claim 7, wherein the mask pattern is adapted to expose a predetermined underside area of the package substrate and cover a top surface of the package substrate.

9. The fabrication method according to claim 1, wherein said light emitting device mounting step (c) comprises:
   connecting the light emitting device to one of the package electrode parts by die bonding; and
   connecting the light emitting device to the other package electrode part at the bottom of the recess by wire bonding.

10. The fabrication method according to claim 1, wherein said light emitting device mounting step (c) comprises: connecting the light emitting device to the package electrode parts by wire bonding of two wires.

11. The fabrication method according to claim 1, wherein said light emitting device mounting step (c) comprises: flip-chip bonding the light emitting device on the package electrode parts at the bottom of the recess.

12. The fabrication method according to claim 1, further comprising a step of: forming a reflective metal film on a side surface of the recess before said light emitting device mounting step (c).

13. The fabrication method according to claim 1, wherein the reflective metal film is made of one selected from a group consisting of Au, Ag, Ti and Al.

14. The fabrication method according to claim 1, further comprising a step of: surface-treating the bottom of the recess with metal selected from a group consisting of Au, Ag and Al before said light emitting device mounting step (c) in order to facilitate mounting of the light emitting device.

15. The fabrication method according to claim 1, further comprising a step of: surface-treating the bottom of the package substrate by Au or Ag plating before said light emitting device mounting step (c).

16. The fabrication method according to claim 1, further comprising a step of: bonding an optical element to a top of the package substrate after said light emitting device mounting step (c).

17. A fabrication method of light emitting diode packages, comprising steps of:
   preparing a metallic package substrate having a plurality of recesses and a plurality of reflecting surfaces each formed in each of the recesses;
   selectively anodizing the package substrate into individual package electrode parts; and
   mounting a plurality of light emitting devices on the package substrate, each of the light emitting devices being placed on a bottom of each of the recesses.

18. The fabrication method according to claim 17, further comprising a step of: bonding an optical element on a top of the package substrate.

19. The fabrication method according to claim 17, further comprising a step of: severing the package substrate into individual light emitting diode packages.

* * * * *